(12) United States Patent
Yamamoto

(10) Patent No.: US 7,388,393 B2
(45) Date of Patent: Jun. 17, 2008

(54) SEMICONDUCTOR TEST APPARATUS

(75) Inventor: Kazuhiro Yamamoto, Tokyo (JP)

(73) Assignee: Advantest Corporation, Tokyo (JP)

( * ) Notice: Subject to any disclaimer, the term of this patent is extended or adjusted under 35 U.S.C. 154(b) by 410 days.

(21) Appl. No.: 10/871,113

(22) Filed: Jun. 18, 2004

(65) Prior Publication Data

US 2004/0223358 A1   Nov. 11, 2004

Related U.S. Application Data

(63) Continuation of application No. PCT/JP02/13235, filed on Dec. 18, 2002.

(30) Foreign Application Priority Data

Dec. 18, 2001  (JP)  ............................. 2001-384132

(51) Int. Cl.
*G01R 31/26* (2006.01)
*G11C 7/00* (2006.01)
*G06F 11/00* (2006.01)

(52) U.S. Cl. .................. 324/765; 365/201; 714/25

(58) Field of Classification Search .................. None
See application file for complete search history.

(56) References Cited

U.S. PATENT DOCUMENTS

| | | | |
|---|---|---|---|
| 5,724,365 A * | 3/1998 | Hsia et al. ............... | 714/718 |
| 6,138,256 A * | 10/2000 | Debenham .............. | 714/724 |
| 6,166,013 A | 12/2000 | Coghlan et al. ......... | 514/239.5 |
| 6,202,180 B1 | 3/2001 | Nose ....................... | 714/718 |
| 6,256,757 B1 * | 7/2001 | Arkin ....................... | 714/718 |
| 6,684,173 B2 * | 1/2004 | Kessenich et al. ....... | 702/117 |
| 6,788,595 B2 * | 9/2004 | Nguyen et al. ........... | 365/200 |
| 7,112,979 B2 * | 9/2006 | Arabi et al. .............. | 324/765 |
| 7,155,300 B2 * | 12/2006 | Akram et al. ............ | 700/121 |

FOREIGN PATENT DOCUMENTS

| | | |
|---|---|---|
| JP | 54-48130 | 4/1979 |
| JP | 5-28800 | 2/1993 |
| JP | 9-245497 | 9/1997 |

(Continued)

OTHER PUBLICATIONS

Patent Abstracts of Japan, Publicatin No. 09-245497, Publication Date: Sep. 19, 1997, 1 page.

(Continued)

*Primary Examiner*—Ha Tran Nguyen
*Assistant Examiner*—Roberto Velez
(74) *Attorney, Agent, or Firm*—Osha Liang LLP

(57) ABSTRACT

A semiconductor test apparatus is provided that has a function for picking a device as a non-defective device with a limited function (i.e., class B device) even if that device includes one or more defective cells satisfying a predetermined condition. In order to achieve this, the semiconductor test apparatus for classifying devices under test (DUTs) into non-defective devices or defective devices, wherein a DUT including one or more defective cells satisfying a predetermined condition that is acceptable in a specific application is a specifically used DUT (class B device), includes: a specific application classifying means for determining for each of the DUTs whether or not one or more defective cells satisfy the predetermined condition that is acceptable, thereby picking the specifically used DUTs.

21 Claims, 11 Drawing Sheets

FOREIGN PATENT DOCUMENTS

| JP | 11-7761 | 1/1999 |
| JP | 11-213695 | 8/1999 |
| JP | 11-339498 | 12/1999 |
| JP | 2000-306395 | 11/2000 |
| JP | 2002-174664 | 6/2002 |
| JP | 2002-352596 | 12/2002 |
| JP | 2002-373495 | 12/2002 |

OTHER PUBLICATIONS

Patent Abstracts of Japan, Publication No. 54-048130, Publication Date: Apr. 16, 1979, 1 page.

Patent Abstracts of Japan, Publication No. 11-007761, Publication Date: Jan. 12, 1999, 1 page.

Patent Abstracts of Japan, Publication No. 2002-174664, Publication Date: Jun. 21, 2002, 1 page.

Patent Abstracts of Japan, Publication No. 2002-352596, Publication Date: Dec. 6, 2002, 1 page.

Patent Abstracts of Japan, Publication No. 2002-373495, Publication Date: Dec. 26, 2002, 1 page.

Patent Abstracts of Japan, Publication No. 2000-306395, Publication Date: Nov. 2, 2000, 1 page.

Patent Abstracts of Japan, Publication No. 11-213695, Publication Date: Aug. 6, 1999, 1 page.

Patent Abstracts of Japan, Publication No. 05-028800, Publication Date: Feb. 5, 1993, 1 page.

Patent Abstracts of Japan, Publication No. 11-339498, Publication Date: Dec. 10, 1999, 1 page.

International Search Report, dated Feb. 25, 2003, 3 pages.

* cited by examiner

REPAIRABLE CHIP

NON-REPAIRABLE CHIP

NON-REPAIRABLE CHIP

NON-REPAIRABLE CHIP

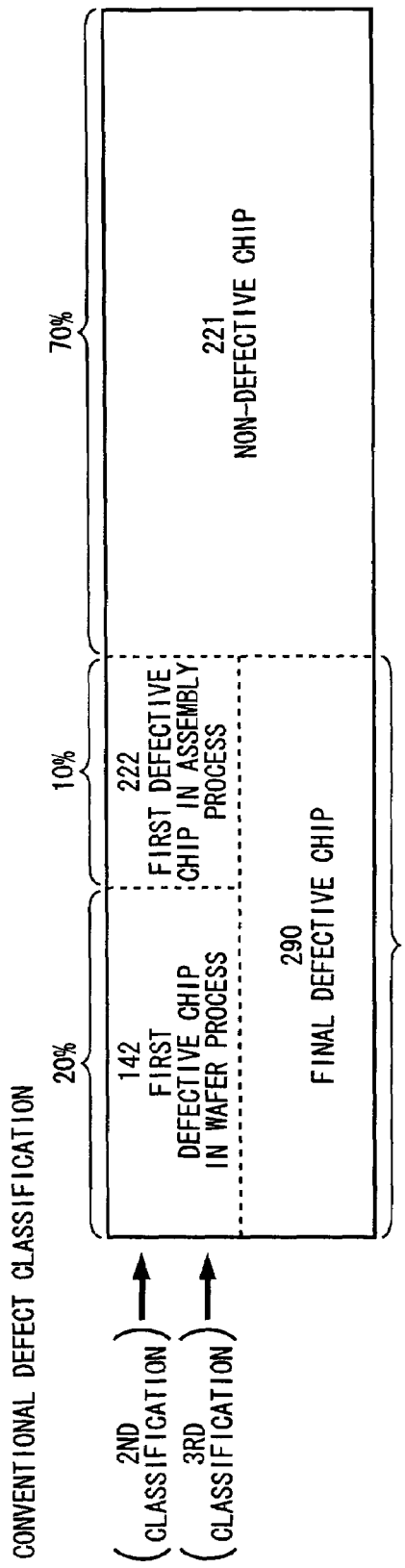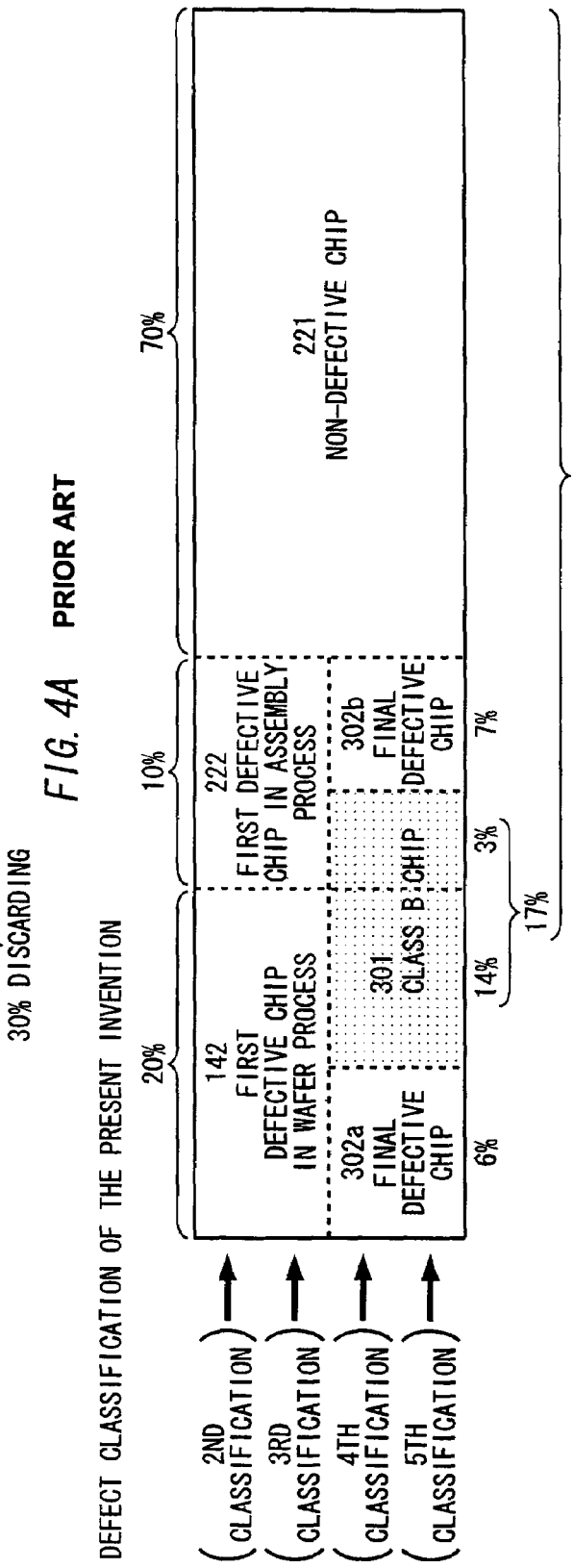

SEMICONDUCTOR TEST APPARATUS

The present application is a continuation application of PCT/JP02/13235 filed on Dec. 18, 2002 which claims priority from a Japanese Patent Application No. 2001-384132 filed on Dec. 18, 2001, the contents of which are incorporated herein by reference.

FIELD OF THE INVENTION

The present invention relates to a semiconductor test apparatus that can screen a device corresponding to a device under test (DUT) that can be applied to a specific application. More particularly, the present invention relates to a semiconductor test apparatus having a function of selecting a DUT as a non-defective product with a limited function (class B product), such as an image memory used in a display, even if the DUT includes one or more defective memory cells satisfying a predetermined condition.

RELATED ART

The background of the art of the present application is described. In an image memory used in a CRT display or LCD display, three primary colors, i.e., R, G and B are presented by a 24-bit unit memory. The luminance of each primary color is represented by an 8-bit weight.

If a memory cell of a lower bit, such as LSB, in the 8-bit weight is defective, a person who observes a display presented by a screen of the display cannot recognize that he or she observes defective color. In other words, from a viewpoint of displaying an image, such a defective cell brings about no obstacle practically.

FIG. 10 shows a luminance-defective site on the display, which is enlarged, as shown in circles. It is assumed that a dot presentation shown in each circle has luminance change that human's eyes cannot recognize, although that dot presentation is slightly different from its original and normal state of luminance.

In area A, defective color presentation occurs at a plurality of sites that are dispersed on the display screen. However, in this case, a man hardly recognizes that the defective color presentation exists at those sites. Thus, the memory cell of this case can be practically used.

On the other hand, in a case where the sites with defective color presentation are concentrated, as shown in area B, a man can recognize that there is defective color presentation. Similarly, in a case where the sites with defective color presentation form a line, as shown in areas C, D, and E, a man can also recognize that defective color presentation. The memory device with such recognizable defective color presentation cannot be used practically. Moreover, in a case where a memory cell of an upper bit on an MSB side is defective, that defect greatly changes luminance even if the defective bit is only one. Thus, defective color presentation can be recognized.

Thus, it is found that in a case of a memory device used for a specific application like the image memory described above, even if the memory device includes one or more defective cells satisfying a limited condition, the memory device can be used as a device comparable to a non-defective device. Hereinafter, such a memory device that can be used while its function is limited, is called as a class B device.

Next, FIG. 1 is a conceptual diagram of a semiconductor test apparatus in a case where it includes a remedy analysis device for repairing a memory device. Main components of the semiconductor test apparatus include a timing generator TG, a pattern generator PG, a format controller FC, pin electronics PE, a sense controller SC, a fail memory FM and the remedy analysis device 10. Component in the fail memory FM, related to the present application, include a defect analysis memory AFM. Please note that, because the semiconductor test apparatus is known and its techniques are also well known, signals and components of the semiconductor test apparatus, as well as detailed description thereof, are omitted except for the main components related to the present application.

The defect analysis memory AFM includes high-speed storage devices as many as DUTs that are measured simultaneously. Each of the storage devices has a memory structure that is the same as the DUT in at least the data width and address space, and the operation speed thereof is equal to or higher than the access speed of the DUT.

In an operation for storing a fail occurring in the DUT, an address signal corresponding to a reading address of the DUT is sent from the pattern generator PG. In accordance with that address signal, fail information FAIL from the sense controller SC is accumulated and stored at a corresponding address position in the AFM.

The remedy analysis device 10 performs remedy analysis so as to enable repair using a small number of spare rows SR and a small number of spare columns SC, as shown in FIG. 2. More specifically, after completion of a predetermined test, the fail information stored in the defect analysis memory AFM is sequentially read out and is subjected to analysis in order to replace a row address line or column address line on which the fail exists with a spare line. In order to achieve this, based on the fail information for every row address line or column address line that includes the fail, a row line and a column line to be replaced with spare lines for repair are identified. Then, information about the identified row and column lines is sent as repair information to a repair process.

FIG. 2 is a diagram illustrating the principle of remedy of eight defective cells by using spare lines (a small number of spare rows SR and a small number of spare columns SC). This remedy is described below.

In a semiconductor memory, represented by a DRAM, one memory chip is formed by a main cell for storing data and an auxiliary cell in form of lines in the vicinity of the memory cell, including a limited number of spare rows SR and a limited number of spare columns SC. In this description, it is assumed that two spare rows SE and two spare columns SC are provided for simplicity and clearness. In FIGS. 2A to 2D, a cross at each of eight positions represents a defective cell existing that position. Thus, it is assumed that, in each of cases shown in FIGS. 2A to 2D, there are defective cells at the positions shown with crosses.

In FIG. 2A, eight defective cells existing at the positions shown with crosses can be remedied by using four spare lines. Thus, the chip shown in FIG. 2A is subjected to repair using the spare lines and thereafter is packaged. Finally, that chip is subjected to a final device test.

In a case of FIG. 2B, seven defective cells shown with crosses can be remedied by four spare lines. However, the remaining one defective cell cannot be remedied (shown with A in FIG. 2B). Thus, in this case, this chip is discarded in this process as a non-repairable chip.

Similarly, in cases of in FIGS. 2C and 2D, although defective cells existing at seven or six positions shown with crosses can be remedied by using four spare lines, the remaining one or two defective cells (shown with B and C in FIGS. 2C and 2D, respectively) cannot be remedied. Thus, in those cases, the chip is discarded in this process.

FIG. 3 is a conceptual diagram entirely illustrating processes for classifying memory devices into non-defective devices and defective devices. In this diagram, it is assumed that a case is illustrated in which test is performed for devices on wafer, repair and packaging processes follow that test, and final test is then performed.

In a process of wafer processing 100, a number of circuits that will constitute products are formed on wafer, and the wafer is placed in a state in which it can be subjected to electric test using a wafer probe device.

In a process of probe test before repair 110, a number of circuit chip formed on the wafer, to which the wafer probe apparatus is applied, is tested by a semiconductor test apparatus for a function of the circuit of the chip. In this test, in a case where a DUT is a memory device, all memory cells on the wafer are tested whether or not there is any defective cell. Fail information that indicates the test result is stored at an address position, corresponding to that DUT, of the defect analysis memory AFM. Based on the test result, the first classification is performed for the circuit chips individually, thus classifying the circuit chips as the first all-bit non-defective chips 121, repairable chips 122 and defective chip chips 123. Please note that the description of defects other than the defect of the memory cell is omitted in the present application because a chip including any of those other defects should be discarded.

Then, in order to perform a repair process, the remedy analysis device 10 generates predetermined repair information 114s that enables the repair process to be performed, and supplies that repair information 114s to a repairing device.

In the repair process 130, the repairable chip 122 that was classified in the first classification is repaired based on the repair information 114s.

In a process of probe test after repair 140, the function of the circuit of the chip is tested again for the first all-bit non-defective chips 121, repaired chips and the defective chip chips 123. Based on the result of that test 140, the second classification is performed, thus classifying the tested chips into the second all-bit non-defective chips 141 and the first defective chip chips 142. The second all-bit non-defective chips 141, that were determined to be repairable in this process, are supplied to an assembly process 200, while the first defective chip chips 142 are discarded as final defective chips 290.

In the assembly process 200, the second all-bit non-defective chips 141 are packaged into a predetermined package, thus becoming a device product in a predetermined IC lead form.

In a process of package test 210, the DUT accommodated in the package as mentioned above is tested on all functions necessary for an IC product and is also rated depending on characteristics. In this test, all functions satisfying the specification of the IC product are tested. More specifically, this test is performed for checking a defect caused by the assembly or on test items that could not be tested in the probe test before repair 110 or the probe test after repair 140.

Based on the result of the above test, the third classification is performed in which normal DUTs are classified as the third all-bit non-defective DUTs 221. Those DUTs are shipped as products 280 after being rated in a predetermined manner 270. The rating depending on the characteristics of the DUT is applied in a case where the products are shipped as rated products. For example, the products are rated based on performances such as a memory access time, or DC characteristics such as a consumed current.

On the other hand, the DUTs that were determined to be defective are classified as the second defective DUTs 222. Thus, those DUTs 222 are finally collected as the final defective products 290 that should be discarded. The second defective DUTs 222 include a DUT that is defective on an item other than the memory cell test, and also include many DUTs that were determined to be defective because of at least one defective bit of all memory cells.

As described above, the final defective products 290 include the first defective chips 142 from the probe test after repair 140 and the second defective chips 222 from the package test 210. Those defective products are to be discarded. Those final defective products 290 include many products that were determined to be defective because of one or more defective bits of all memory cells.

On the other hand, in an application such as the use as the image memory described above, class B products which include one or more defective cells are comparable to a non-defective product, as long as a limited condition is satisfied, and therefore they can be shipped as products. However, a conventional semiconductor test apparatus does not include a means for selecting such class B products.

Next, FIG. 4A illustrates a rate of a defective DUT in all DUTs in a conventional defect classification. This conventional classification is described below. It is assumed that a rate of the defective DUT that was determined to be defective in the wafer pre-processing 100 and that of the defective DUT that was determined to be defective in the package test 210 are 20% and 10%, respectively.

A rate of the final defective product 290 that was determined to be defective as a result of a series of test is 30%. In a case of using the conventional semiconductor test apparatus, a defect rate is as large as 30%, which is significantly large, because the conventional semiconductor test apparatus does not include a means for selecting the class B products.

Thus, there is a problem that an effective yield decreases because the selection of the class B products is not performed. This increases the unit price of fabrication of the DUT.

As described above, the conventional technique has a problem that the effective yield decreases because the selection of the class B products is not performed. Moreover, from a viewpoint of the fabrication cost the DUT, the unit price of fabrication becomes higher. From those reasons, the conventional semiconductor test apparatus is undesirable and has problems from a practical viewpoint.

On the other hand, as described in the example of the image memory used in the display, even in a case where a memory device includes a plurality of defective cells, it can be used in a specific application without any problem as long as a particular condition is satisfied.

SUMMARY OF THE INVENTION

Thus, it is an object of the present invention to provide a semiconductor test apparatus including a function of picking a product that can be regarded as a non-defective product when a function is limited, even if it includes one or more defective cells satisfying a predetermined condition.

The first means to solve the above problem is described. In a semiconductor test apparatus for classifying devices under test after wafer process or after assembly process, each of which has a memory function or includes the memory function therein, into non-defective devices or defective devices, while a DUT including a defective cell within a range of a predetermined condition that is acceptable in a specific application (for example, usage as an image memory) is called as a specifically used DUT (class B device), a specific application classifying means is provided for determining for each of the DUTs whether or not the defective cell satisfies the predetermined distribution condition that is acceptable, to classify the DUTs into non-defective devices in which all memory cells work normally, the specifically used DUTs and defective devices.

Next, the second means to solve the above problem is described.

In the above-described specifically used DUTs are classified into a plurality of types, the number of the types being M, and the specific application classifying means determines based on M types of threshold conditions corresponding the M types of the specifically used DUTs, whether or not the defective cell satisfies the predetermined distribution condition that is acceptable, thereby classifying the DUTs into the non-defective products in which all the memory cells work normally, the M types of specifically used DUTs (for example, class B devices, class C devices, class D devices and the like) and the defective devices.

Next, the third means to solve the above problem is described. FIG. 6 shows this means of the present invention.

As one embodiment of the above-described specific application classifying means, a means is considered that includes at least a defective cell counting means (for example, a total fail counter 81 and a total fail number determination unit 82) for counting the number of total defective cells in all the memory cells of each DUT and outputting a total fail signal that indicates determination whether or not the counted number is acceptable, and determines the DUT to be the specifically used DUT when the number of the defective cells is equal to or less than a particular number.

Next, the fourth means to solve the above problem is described. FIG. 6 also shows this means of the present invention.

One embodiment of the above defective cell counting means continuously receive FAIL information or PASS information, that indicates a result of determination whether or not each memory cell is defective in the DUT, and includes a total fail counter 81 for counting a total number of fail occurrences of the FAIL information; and a total fail number determination unit 82 for outputting a total fail signal 82s in a case where the total number of fail occurrences is equal to or larger than a predetermined threshold value.

Next, the fifth means to solve the above problem is described. FIGS. 8 and 9 show this means of the present invention.

One embodiment of the above specific application classifying means includes at least a defective cell dispersed condition measuring means (for example, a consecutive PASS counter 31 and a consecutive PASS number determination unit 41) for measuring a condition of dispersion of occurrences of defective cells in all the memory cells in each DUT and outputting a minimum consecutive PASS defective signal 41s indicating a result of determination whether or not the measured dispersed condition is acceptable, and determines the DUT to be the specifically used DUT when the occurrences of the defective cells are dispersed with a predetermined dispersed condition.

Next, the sixth means to solve the above problem is described. FIGS. 8 and 9 also show this means of the present invention.

One embodiment of the above defective cell dispersed condition measuring means continuously receives FAIL information or PASS information, that indicates a result of determination whether or not each memory cell in the DUT is defect, and includes: a consecutive PASS counter 31 for counting a number of consecution of the PASS information in a predetermined fail section based on a fail-section setting register 44; and a consecutive PASS number determination unit 41 for outputting a minimum consecutive PASS defective signal 41s in a case where the number counted by the consecutive PASS counter 31 is equal to or less than a predetermined threshold value.

Next, the seventh means to solve the above problem is described. FIG. 11 shows this means of the present invention.

One embodiment of the above specific application classifying means includes at least a defective cell distribution condition measuring means (for example, a section fail counter 51 and a section fail number determination unit 52) for measuring a condition of distribution of occurrences of defective cells in all the memory cell of the DUT and outputting a section fail signal that indicates a result of determination whether or not the measured condition is acceptable, and determines the DUT to be the specifically used DUT when the occurrences of the defective cells are distributed with a predetermined distribution condition.

Next, the eighth means to solve the above problem is described. FIG. 11 also shows this means of the present invention.

One embodiment of the above defective cell distribution condition measuring means continuously receives FAIL information or PASS information, that indicates a result of determination by a sense controller SC whether or not each memory cell of the DUT is defective, and includes: a predetermined plurality of section fail counters 51 for dividing all the memory cells into a predetermined plurality of sections and counting a number of fail occurrences in each of the sections; and a section fail number determination unit 52 for outputting a section fail signal 53s when a counted value of any of the section fail counters 51 exceeds a predetermined threshold value.

Next, the ninth means to solve the above problem is described. FIG. 6 shows this means of the present invention.

One embodiment of the above specific application classifying means includes at least a consecutive defects determining means (for example, a consecutive FAIL counter 32 and a consecutive FAIL number determination unit 42) for counting a number of consecutive occurrences of defective cells in all the memory cells in the DUT and outputting a consecutive FAIL accepting signal that indicates a result of determination whether or not the counted number is acceptable, and determines the DUT to be the specifically used DUT when the counted number is equal to or less than a particular number.

Next, the tenth means to solve the above problem is described. FIG. 6 also shows this means of the present invention.

One embodiment of the above consecutive defects determining means continuously receives FAIL information or PASS information, that indicates a result of determination by a sense controller whether or not each memory cell of the DUT is defect, and includes: a consecutive FAIL counter 32 for counting a number of consecution of the FAIL information; and a consecutive FAIL number determination unit 42 for outputting a consecutive FAIL accepting signal 42s in a case where a value counted by the consecutive FAIL counter 32 is equal to or less than a predetermined threshold value.

Next, the eleventh means to solve the above problem is described. FIG. 6 also shows this means of the present invention.

One embodiment of the above specific application classifying means includes: a defective cell counting means (for example, a total fail counter 81 and a total fail number determination unit 82) for counting a number of defective cells in all the memory cells in the DUT as a total fail number and outputting a total fail signal 82s indicating a result of determination whether or not the total fail number thus counted is acceptable; a consecutive defect number determination means (for example, a consecutive FAIL counter 32 and a consecutive FAIL number determination unit 42) for counting a number of consecutive occurrences of the defective cells in all the memory cells in the DUT and outputting a consecutive FAIL accepting signal 42s that indicates a result of determination whether or not the thus counted number is acceptable; a defective cell dispersed condition measuring means (for example, a consecutive PASS counter 31 and a consecutive PASS number determination unit 41) for measuring a condition of dispersion of the occurrences of the defective cells in all the memory cells in the DUT and outputting a minimum consecutive PASS defect signal 41s that indicates a result of determination whether or not the measured condition is acceptable; and a class B device determination unit 60 for picking an acceptable class B device based on the total fail signal 82s, the consecutive FAIL accepting signal 42s and the minimum consecutive PASS defect signal 41s.

Next, the twelfth means to solve the above problem is described. FIG. 11 shows this means of the present invention.

One embodiment of the above specific application classifying means includes: a defective cell counting means (for example, a total fail counter 81 and a total fail number determination unit 82) for counting a number of defective cells in all the memory cells in the DUT as a total fail number and outputting a total fail signal 82s indicating a result of determination whether or not the total fail number thus counted is acceptable; a consecutive defect number determination means (for example, a consecutive FAIL counter 32 and a consecutive FAIL number determination unit 42) for counting a number of consecutive occurrences of the defective cells in all the memory cells in the DUT and outputting a consecutive FAIL accepting signal 42s that indicates a result of determination whether or not the thus counted number is acceptable; a defective cell dispersed condition measuring means (for example, a consecutive PASS counter 31 and a consecutive PASS number determination unit 41) for measuring a condition of dispersion of the occurrences of the defective cells in all the memory cells in the DUT and outputting a minimum consecutive PASS defect signal 41s that indicates a result of determination whether or not the measured dispersed condition is acceptable; a defective cell distribution condition measuring means (for example, a section fail counter 51 and a section fail number determination unit 52) for measuring a condition of distribution of the occurrences of the defective cells in all the memory cells in the DUT and outputting a section fail signal 52s that indicates a result of determination whether or not the measured distribution condition is acceptable; and a class B device determination unit 60 for picking an acceptable class B device based on the total fail signal 82s, the consecutive FAIL accepting signal 42s, the minimum consecutive PASS defect signal 41s and the section fail signal 52s.

Next, the thirteenth means to solve the above problem is described. FIG. 5 shows this means of the present invention.

One embodiment of the above specific application classifying means applies a first step of classification to DUTs after a repair process, and applies a second step of classification to DUTs in package test 210b.

Next, the fourteenth means to solve the above problem is described.

One embodiment of the above specific application classifying means applies classification only to DUTs in package test 210b.

The means may be appropriately combined to provide another practical means, if desired. Moreover, the reference numerals given to the above components correspond to those described in preferred embodiments of the invention. However, the above components are not limited thereto, but may be formed by means to which other practical equivalents are applied.

BRIEF DESCRIPTION OF THE DRAWINGS

FIG. 4 is a diagram showing a rate of a defective device in a conventional defect classification and that in a defect classification according to the present invention.

DETAILED DESCRIPTION OF THE INVENTION

Figure 1:
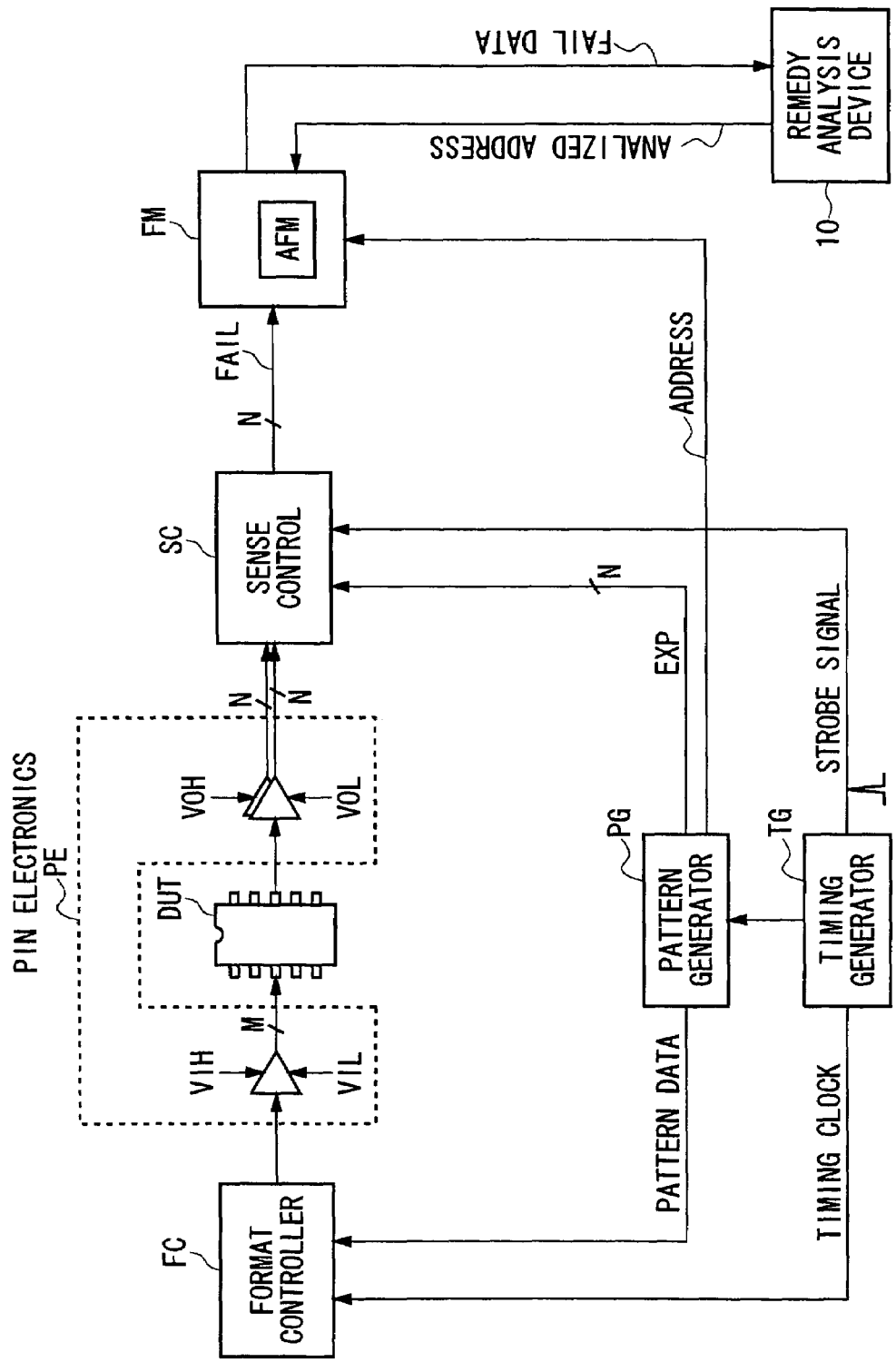
FIG. 1 is a diagram showing a concept of a semiconductor test apparatus in a case where it includes a remedy analysis apparatus for repairing of a memory device.
Figure 2A:
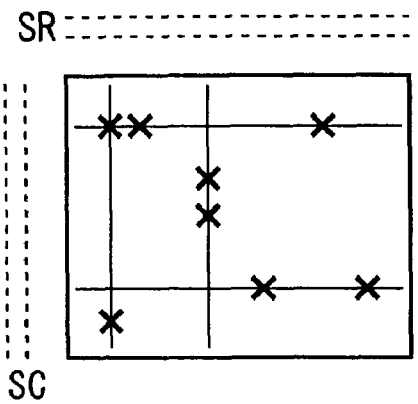
FIG. 2 is a diagram of the principle of remedy in which eight defective cells are repaired by using spare lines (a small number of spare rows SR and a small number of spare columns SC).
Figure 2B:
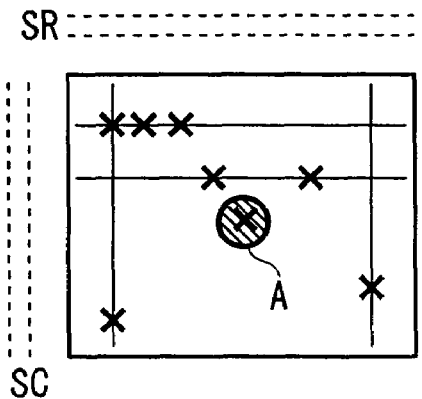
Figure 2C:
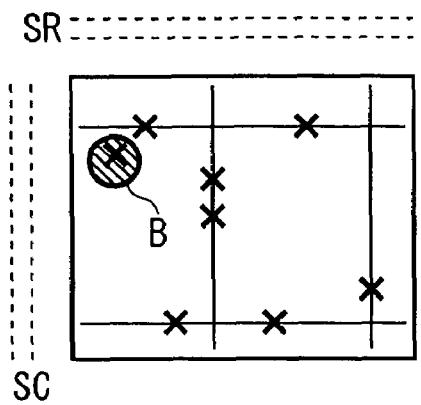
Figure 2D:
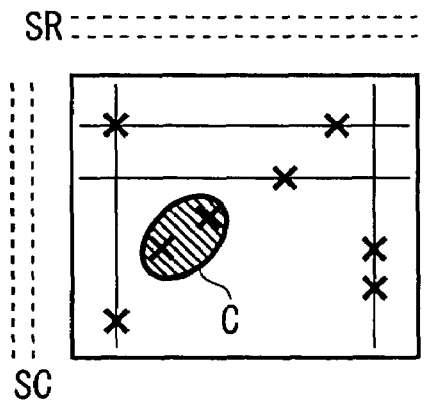
Figure 3:
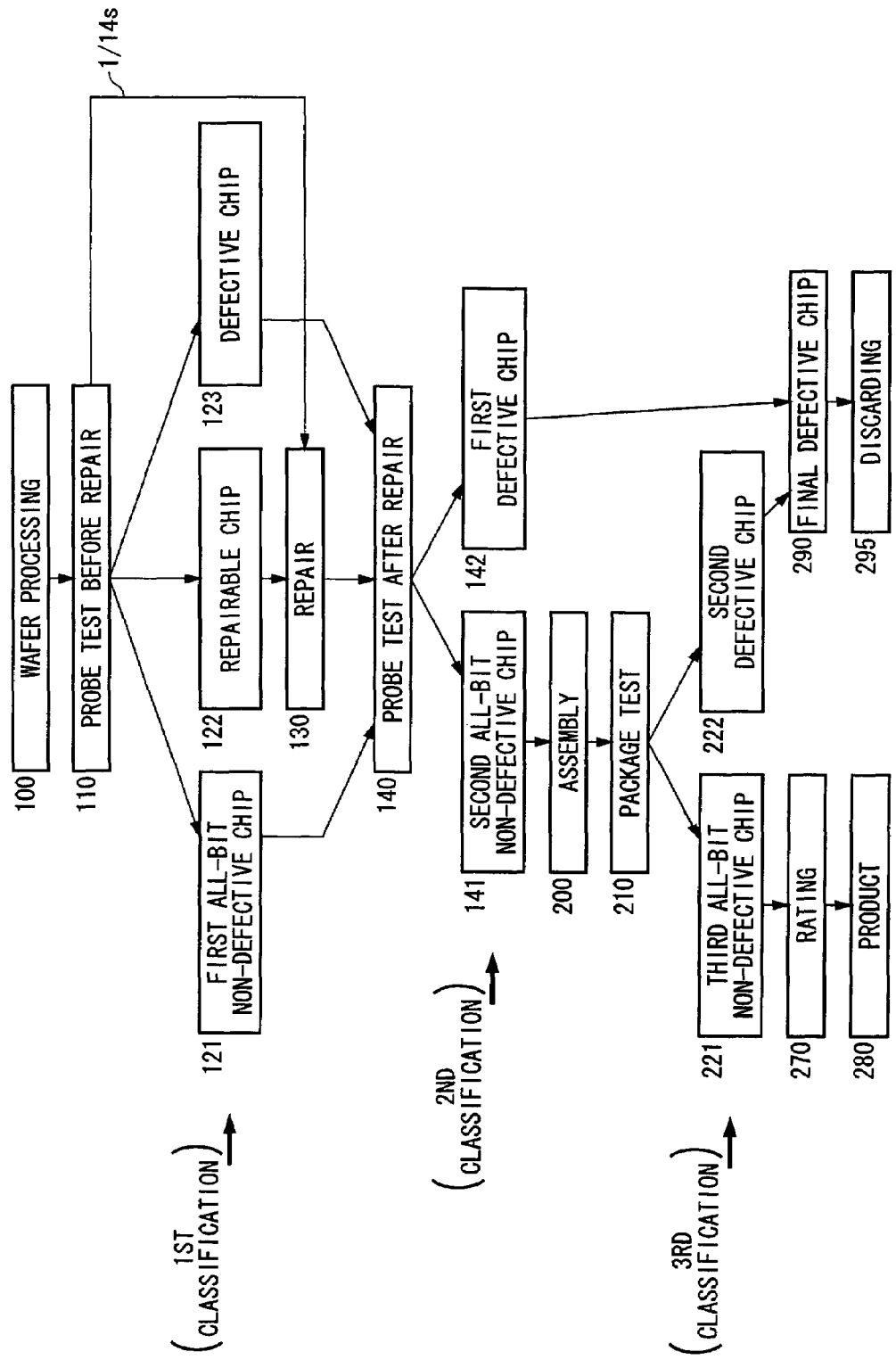
FIG. 3 is a conceptual diagram entirely showing a conventional process for classifying memory devices into non-defective ones and defective ones.

The invention will now be described based on embodiments, referring to the drawings. The following description of the embodiments does not intend to limit the scope of the present invention, but exemplify the invention. All of the components and connections thereof described in the embodiments are not necessarily essential to the invention. Moreover, an exemplary form of the components and connections are described in the embodiments. However, the present invention is not limited those components and connections.

The present invention is described below, referring to FIGS. 4 through 9. Components in those drawings, that correspond to the components of the conventional semiconductor test apparatus, are labeled with the same reference numerals, and the description of the redundant portions is omitted.

Figure 5:
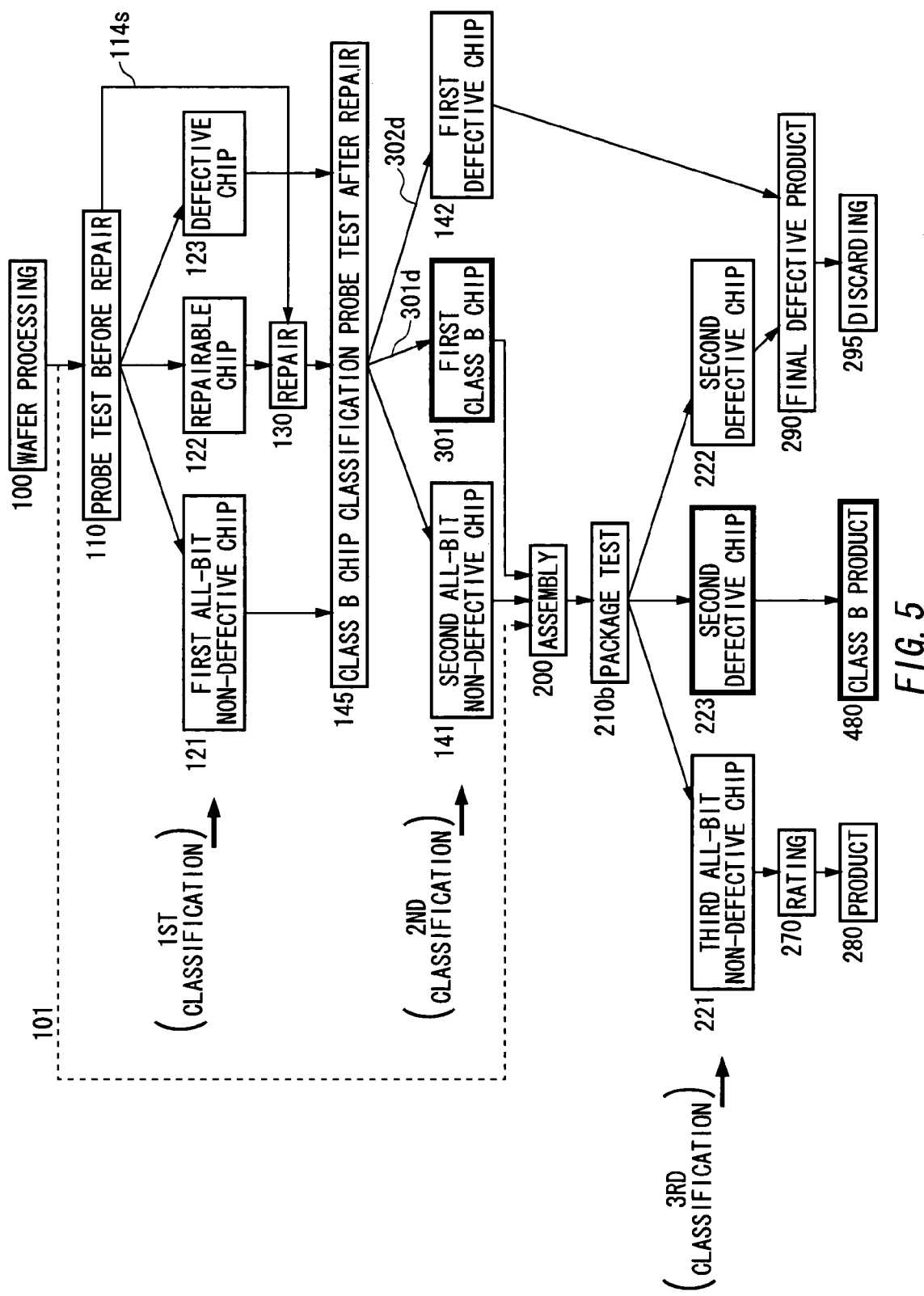
FIG. 5 is a conceptual diagram entirely showing a process for classifying memory devices into non-defective ones and defective ones, according to the present invention.

FIG. 5 shows an entire process of classification of memory devices into defective devices and class B devices. This classification is described.

According to the present invention, devices that passed the probe test after repair 140 are classified into two types, i.e., all-bit non-defective devices and the first class B devices. In addition, the final products are set to include not only products obtained in the conventional classification, but also the class B products. In the classification of the present invention, description of parts that are the same as those in the conventional classification are omitted.

Figure 6:
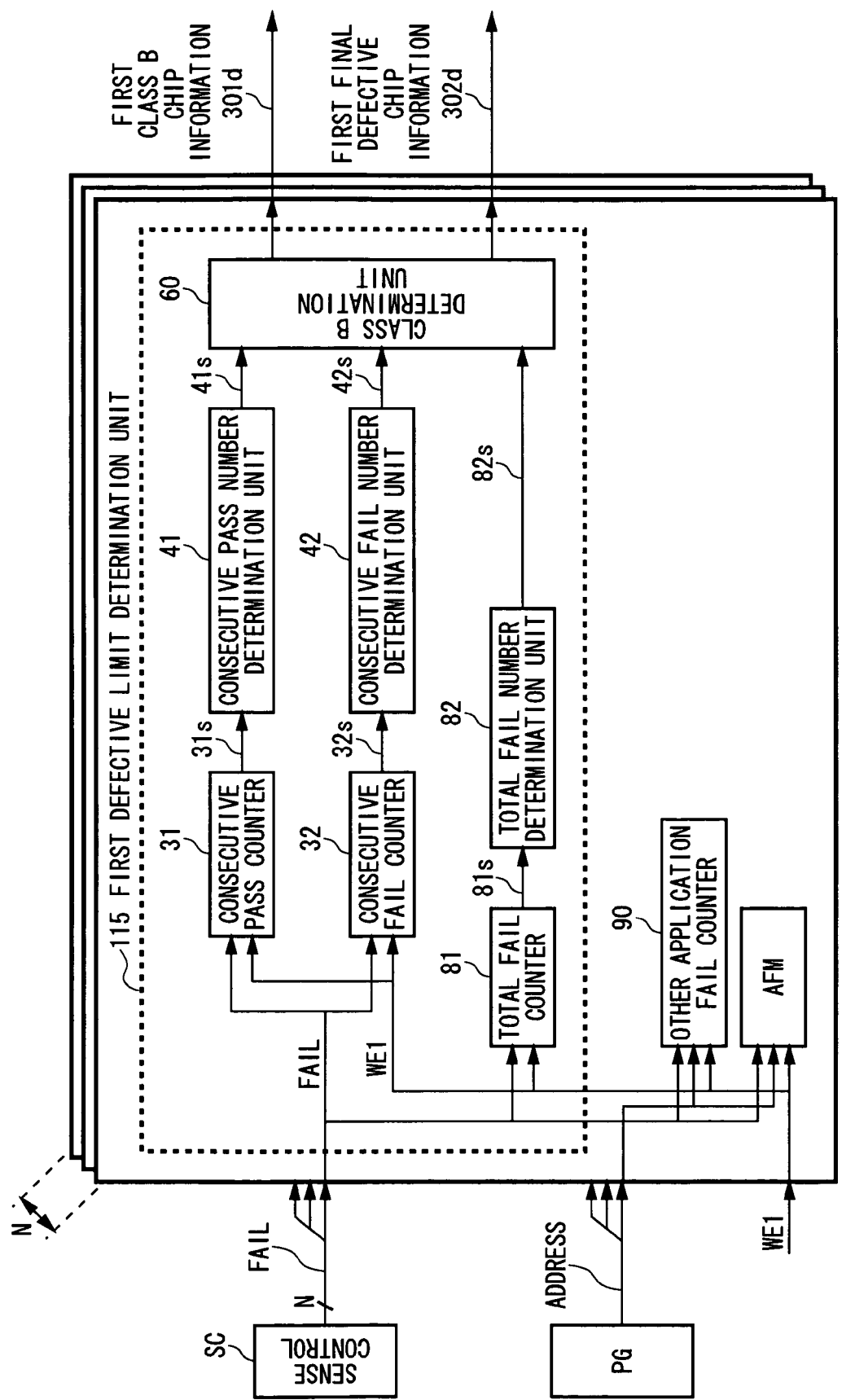
FIG. 6 is a diagram of an exemplary structure of a semiconductor test apparatus of the present invention, including the first defective limit determination unit and associated components.

Next, probe test after repair, for class B classification 145 is described, referring to a case where hardware configuration shown in FIG. 6 is applied. In this case, the first defective limit determination unit 115 is an example of a specific structure for making classification of chips including one or more defective cells.

The first defective limit determination unit 115 has the function of the conventional probe test before repair 110, as well as a function of obtaining information indicating whether or not a chip with one or more defective cells corresponds to a class B chip and a determination function, and has N channels, the number of the channels, N, corresponding to a fail signal FAIL received from the sense controller SC. For example, when the defect analysis memory AFM has 1024 channels, the first defective limit determination unit 115 also has 1024 channels.

Figure 7A:
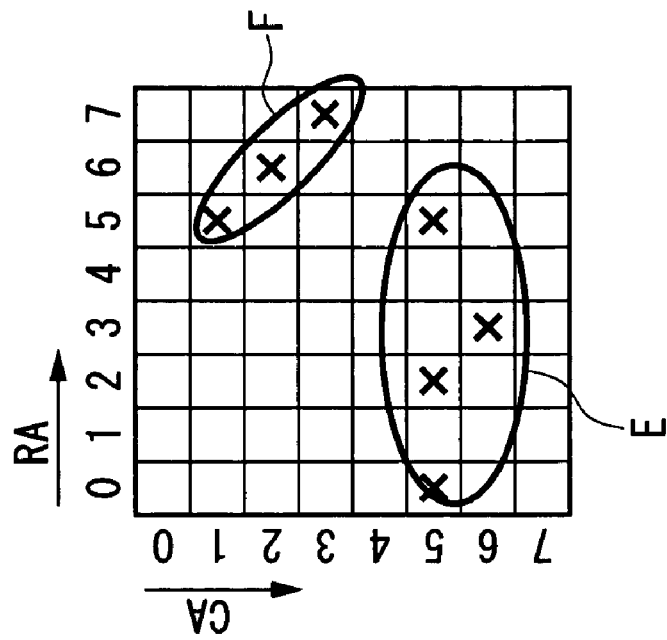
FIG. 7 shows specific examples of positions of occurrence of a defective cell in a memory cell arrangement of 8 bits×8 bits.
Figure 7B:
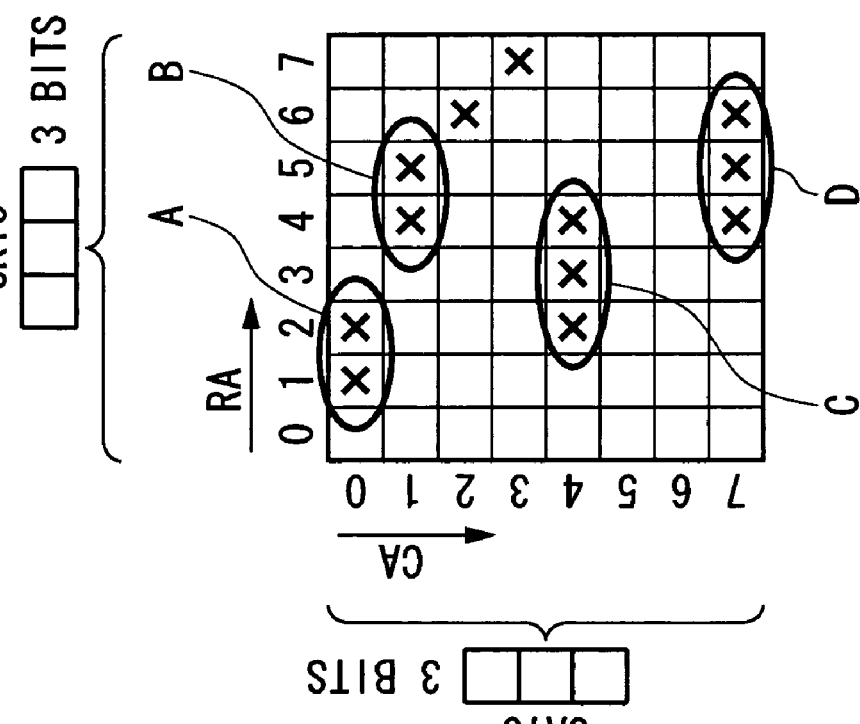
Figure 10:
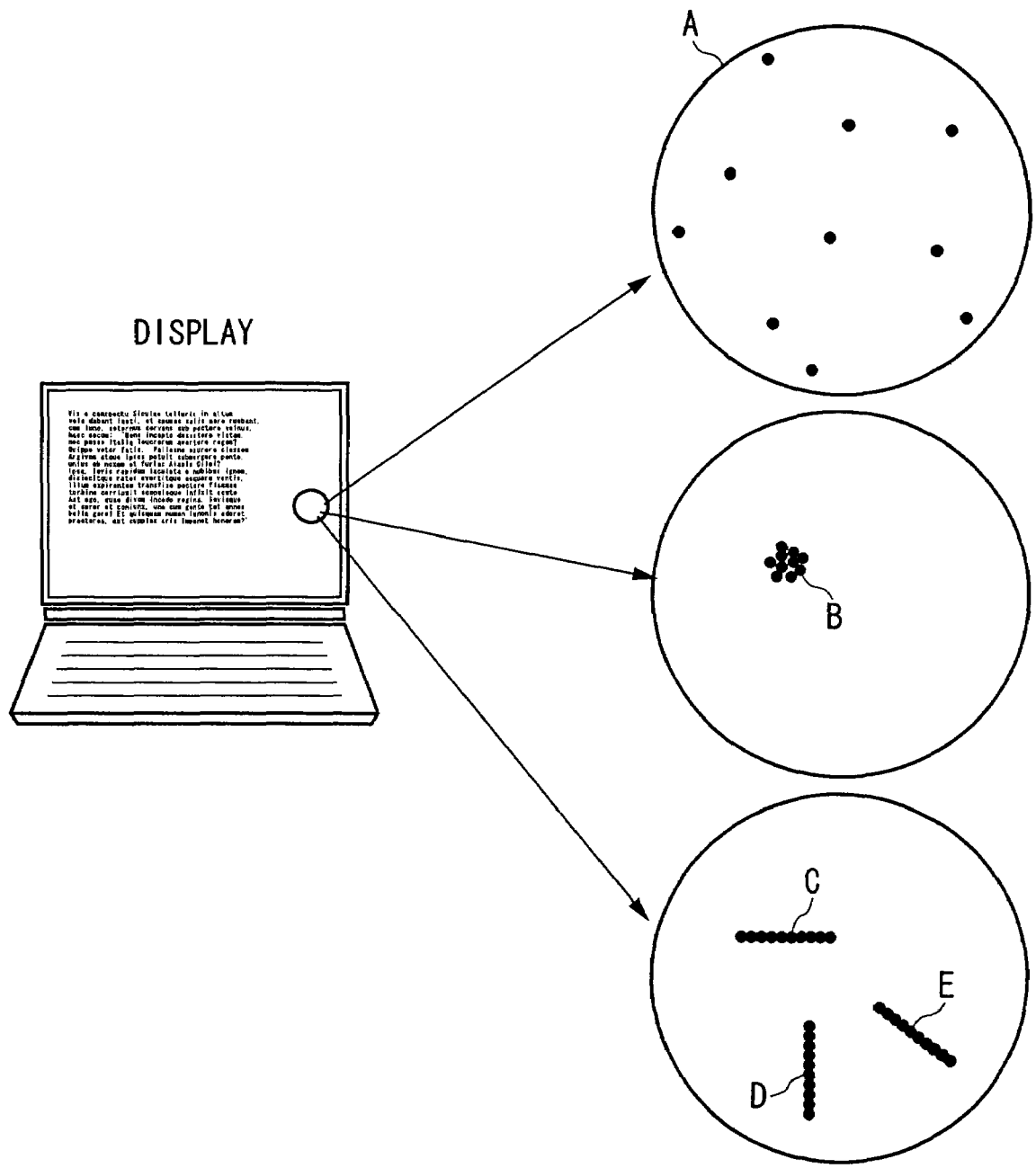
FIG. 10 is an enlarged view of a luminance defective site in a display.

Examples of a specific arrangement of defective cells are shown in FIG. 7. FIG. 7 shows a specific example of occurrence positions of defective cells in a simple memory cell arrangement of 8 bits×8 bits. It is assumed that an address signal supplied from the pattern generator PG occurs in such an order that the address signal for an upper left cell (RA0: CA0) occurs first, then those for cells in the same column line occurs one by one, then those for cells in the next column line, and so on. Finally, the address signal for a lower right cell (RA7: CA7) occurs. Moreover, it is assumed that a chip is determined to be a class B chip when three defective cells do not exist continuously to form a straight line. Conversely, when three or more defective cells exist continuously, that chip is determined to be defective. In addition, an ALPG (Algorithmic Pattern Generator) used as the pattern generator PG can generate an address signal in various ways corresponding to various test purposes. For example, the address signal can be generated in such a manner that the occurrence of the address signal proceeds in the column direction one by one, as shown in D in FIG. 10, or proceeds in both the row and column directions, to proceed in the diagonal direction one by one, as shown in E in FIG. 10.

In a case where the above condition for determining the class B chip, sites A and B shown in FIG. 7 are acceptable as non-defective chips, while sites C and D are to be detected as defective chip chips.

Returning to FIG. 6, one channel of the first defective limit determination unit 115 includes a total fail counter 81, a total fail number determination unit 82, a consecutive PASS counter 31, a consecutive PASS number determination unit 41, a consecutive FAIL counter 32, a consecutive FAIL number determination unit 42 and a class B determination unit 60. The defect analysis memory AFM and the other application fail counter 90 are components that were used in the conventional semiconductor test apparatus, and therefore the description thereof is omitted.

The total fail counter 81 is a 32-bit counter, for example, for counting the total fail number. In the counting operation, while a writing enable signal WE1 (see FIG. 6), that is generated in a test cycle in which a defect is checked by an expected value EXP in the sense controller SC shown in FIG. 1, is asserted, the counter 81 is incremented by one when a fail signal received from the sense controller SC is asserted. As a result, at the end of the test, the total fail number data 81s is obtained.

The total fail number determination unit 82 outputs a total fail signal 82s and supplies it to the class B determination unit 60, when the total fail number data 81s indicates a value equal to or larger than a predetermined threshold value. Please note that a threshold register (not shown) included in the total fail number determination unit 82 can be set and controlled externally to a desired threshold value. Thus, in a case where there are a predetermined number or more fails, the DUT can be determined as the final defective product. For example, if a rate of defective cells to all cells is equal to or larger than 0.01%, that DUT can be determined as the final defective product. Alternatively, if 100 fails, i.e., defective cells exist, that DUT can be determined as the final defective product.

The consecutive PASS counter 31 counts the number of PASS states in consecution. While the write enable signal WE1 is asserted, the counter 31 is incremented by one when no fail signal FAIL was received from the sense controller SC (negated), and is reset to "0" when the fail signal FAIL is asserted. As a result, consecutive PASS number data 31s that changes with time is obtained and is supplied to the next stage.

Figure 9:
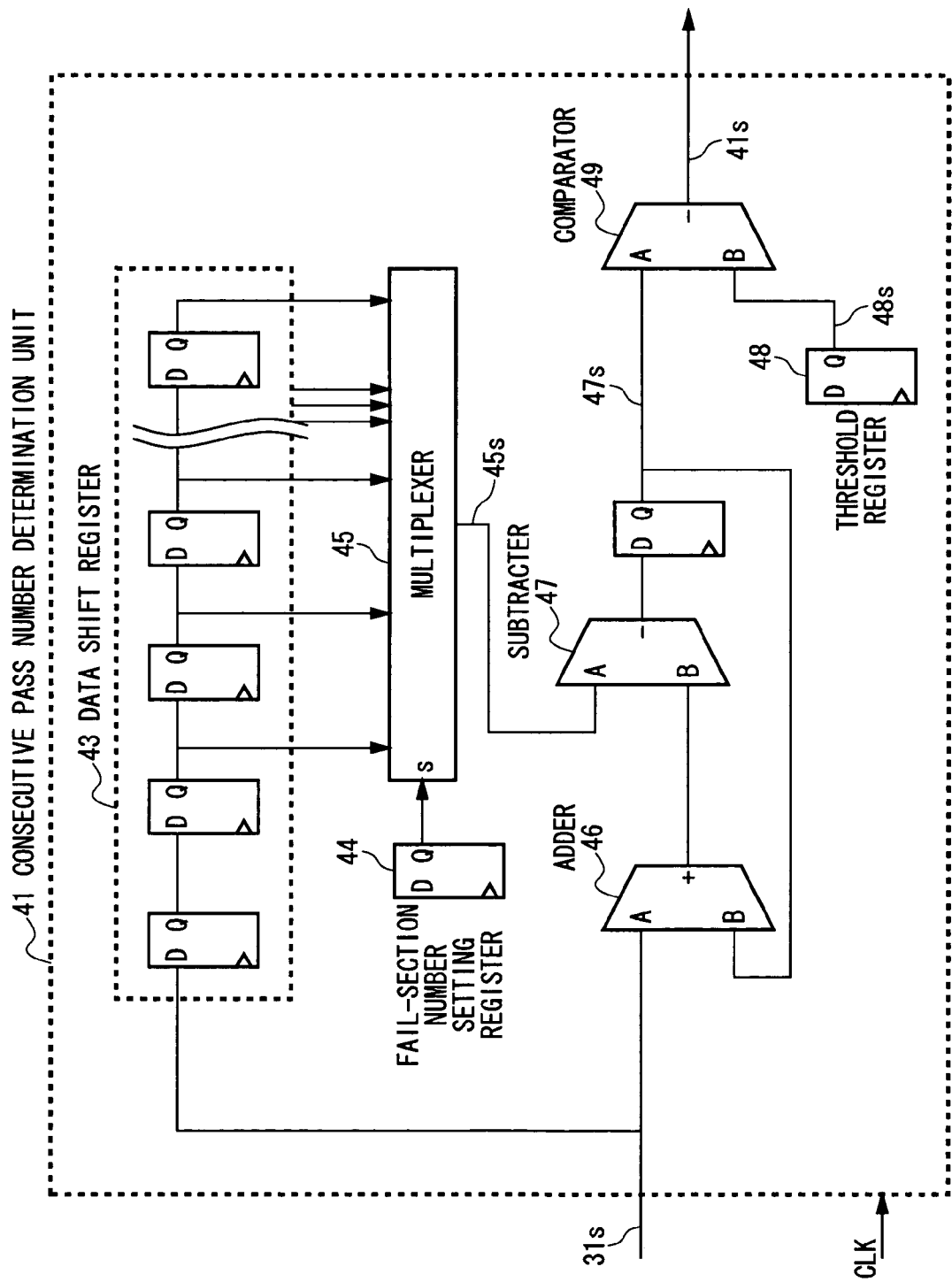
FIG. 9 is a block diagram of a consecutive PASS number determination unit according to the present invention.

The consecutive PASS number determination unit 41 includes, as shown in FIG. 9, a data shift register 43 in a predetermined stages, a fail-section number setting register 44, a multiplexer 45, an adder 46, a subtracter 47, a consecutive PASS number threshold register 48 and a comparator 49.

The fail-section number setting register 44 specifies the number of fail occurrence. For example, the register 44 specifies "3" as the number of fail occurrence. The data shift register 43 receives the past consecutive PASS number data 31s after shifting data corresponding to the number of fail occurrence, and supplies subtraction data 45s to an input end of the subtracter 47. For example, in a case where the number of fail occurrence is "3", data after three units of data were shifted is selected and output as the subtraction data 45s.

The adder 46 and the subtracter 47 calculate the number of PASS occurrence in a section corresponding to the above number of fail occurrences, and continuously output the calculated number of PASS occurrences. More specifically, the adder 46 and the subtracter 47 output a predetermined section PASS number data 47s that is a result obtained by accumulation and addition of the consecutive PASS number data 31s that is input continuously and subtraction of the above-described subtraction data 45s.

The comparator 49 receives the above predetermined section PASS number data 47s so as to compare it with a predetermined threshold value, and outputs and supplies a minimum consecutive PASS defect signal 41s to the class B determination unit 60 when the number of PASS occurrences reaches the threshold value or less. Thus, it can be detected whether or not a case where the number of PASS occurrences is less than 10,000 exists in a section in which FAIL occurred three times. Therefore, it is possible to determine the DUT to be defective. For example, even in a case where the defective cells are not concentrated, as shown in E or F in FIG. 7, the DUT in this case can be detected as the final defective product because there are three or more defective cells close to each other.

Figure 8:
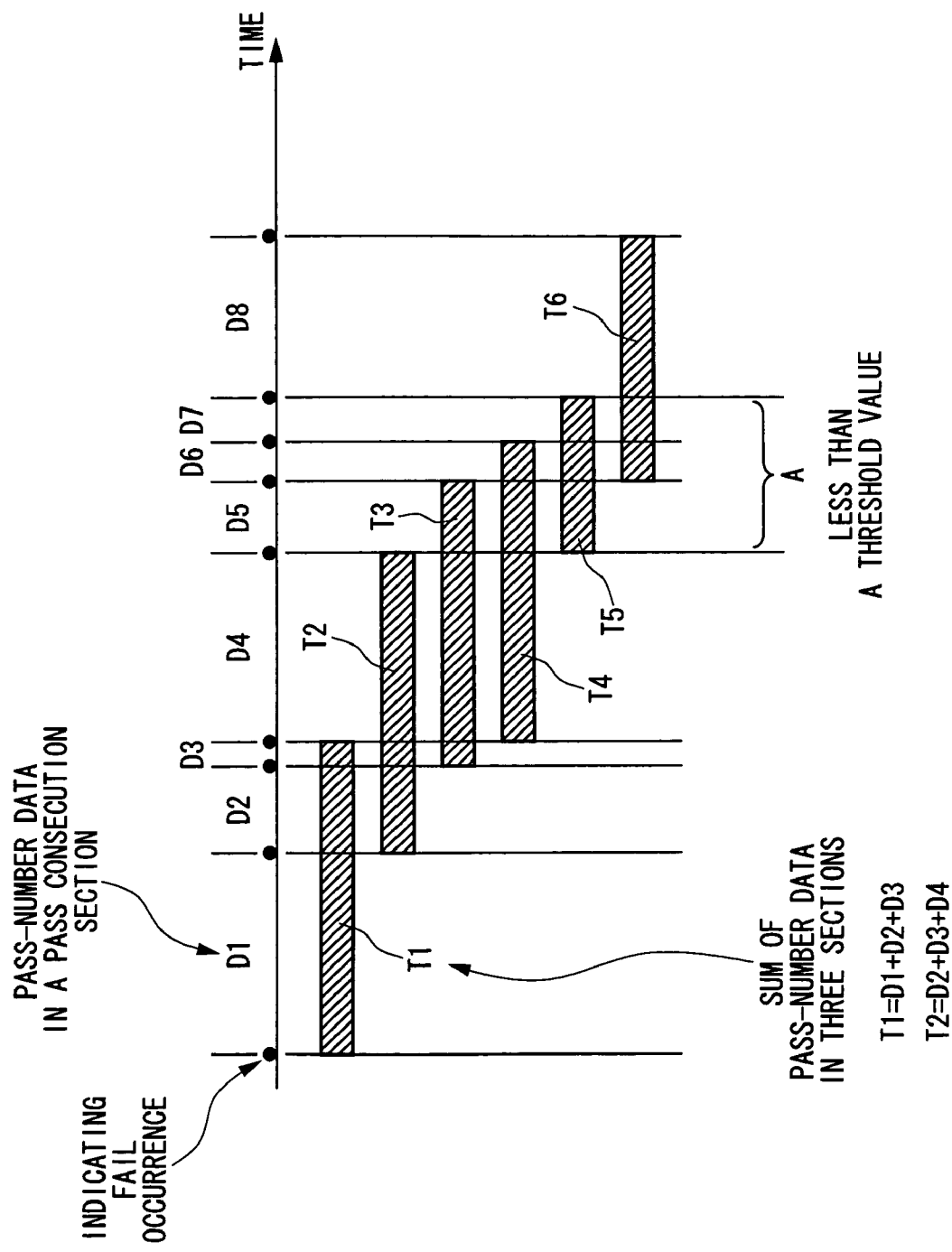
FIG. 8 shows a relationship between consecution of PASS and a fail occurrence.

This determination is described in more detail, referring to FIG. 8 that shows a relationship between consecutive PASS occurrences and the occurrence of fail. In an example shown in FIG. 8, it is assumed that fail-section number setting register 33 in FIG. 9 sets "3". In FIG. 8, one black circle on an axis of PASS/FAIL occurrence time indicates a single occurrence of fail. Each of D1 to D8 is consecutive PASS number data 31s that is received from the consecutive PASS counter 31 sequentially. Each of T1 to T6 represents a predetermined section PASS number data 47s that is a sum of PASS numbers in three sections, output from the subtracter 47 based on the setting of "3". For example, T1=D1+D2+D3, T2=D2+D3+D4, and T3=D3+D4+D5.

Each of T1 to T6 is compared with a predetermined threshold value 48s in the comparator 49. As a result of the comparison, in a case where the predetermined section PASS number data 47s is less than the threshold value like T5 (see A in FIG. 8), the minimum consecutive PASS defect signal 41s is output. This signal 41s is supplied to the class B determination unit 60. Thus, also in a case where occurrences of fail do not continue, the DUT can be determined as the final defective product in an appropriate manner.

Returning to FIG. 6, the consecutive FAIL counter 32 counts the number of consecutive FAIL states. While the write enable signal WE1 is asserted, the counter 32 is incremented by one when the fail signal FAIL received from the logical register SC is asserted, and is reset to "0" when the fail signal FAIL is negated. In most cases, the counter 32 indicates "0". As a result, the consecutive FAIL number data 32s, including a value of "0", is continuously supplied to the next step.

The consecutive FAIL number determination unit 42 outputs a consecutive FAIL accepting signal 42s in a case where the above consecutive FAIL number data 32s reaches a predetermined threshold value or larger. This unit 42 also includes a threshold register (not shown) therein and can be set and controlled to a desired threshold value externally. Thus, number information regarding the number of defective cells that exist continuously, and therefore the determination of the final defective product can be immediately from the number information. For example, as shown in C or D in FIG. 7, when the threshold is set to "3", three consecutive fails can be detected, resulting in determination that the DUT is the final product.

The class B product determination unit 60 receives the total fail signal 82s, the minimum consecutive PASS defect signal 41s and the consecutive FAIL accepting signal 42s, and outputs the first class B device information 301d or the first defective device information 302d that is obtained by determining for each chip whether or not that chip is to be classified into the class B chip based on the above received signals. More specifically, when the total fail signal 82s was detected, and when the minimum consecutive PASS defect signal 41s was detected for even a moment, and when the consecutive FAIL accepting signal 42s was detected for even a moment, the first defective information 302d that indicates the corresponding chip is to be classified into the final defective product is output.

The chip that is not determined to be classified into the final defective product is classified into the first class B chip 301, and the first class B device information 301d is sent to the assembly process 200.

Next, package test 210b shown in FIG. 5 is described. In this test, the second defective limit determination unit for performing classification of the class B devices simultaneously with the conventional package test 210 is additionally provided. The second defective limit determination unit has the same structure as that described in FIG. 6 and therefore the description thereof is omitted. However, in order to classify the class B devices, the threshold condition set as mentioned above referring to FIG. 6 is changed to a desired condition. In this classification, the class B devices are classified into the second class B devices 223 and the second defective devices 222.

According to the invention described above, a DUT that is acceptable as a class B device can be picked in an appropriate manner. As a result, that DUT can be shipped as a class B product 480 finally. Thus, a DUT that is determined as a defective product in accordance with the conventional technique can be shipped as a class B product although the function of the DUT is limited. This provides a great advantage of improving an effective yield. Another effect that the fabrication cost is reduced can be also achieved.

FIG. 4B illustrates a rate of defective DUTs to all DUTs according to the present invention. In the description of this drawing, it is assumed, like the rate of defective DUTs in the conventional classification, that a rate of DUTs determined to be defective in the wafer processing is 20% and a rate of DUTs determined to be defective in the package test 210 is 10%. Moreover, it is assumed that a rate of DUTs that were finally picked as class B devices from the first defective DUTs in the process before probe test, to all DUTs is 14%, and it is also assumed that a rate of DUTs that were finally picked as class B devices from the second defective DUTs in the process after the package test is 3%.

With the above assumptions, the class B DUTs corresponding to a part of the 30% DUTs that are determined to be discarded as the defective product in the conventional classification, can be picked as products. A rate of the class B DUTs to all the DUTs is 14%+3%=17%. As a result, a rate of shipped products to all the DUTs is increased from 70% to 70%+17%=87%. Thus, the yield is improved from 70% to 87%, resulting in the reduction of the fabrication cost.

The technical spirit of the present invention is not limited to the exemplary specific structure or connection of the above embodiment. Moreover, the above embodiment may be modified in an appropriate manner to be applied broadly.

For example, in the above embodiment, the first defective limit determination unit 115 is added and picking of the class B devices is performed on an actual time basis, as shown in FIG. 6. Alternatively, the first defective limit determination unit 115 may be removed. Instead of using it, fail information for all the memory cells of the DUT stored in the defect analysis memory AFM may be read out and classification that is similar to that performed by the first defective limit determination unit 115 may be done by software. Thus, it is possible to pick the class B devices. In this case, since the picking of the class B devices is performed by software, a process time increases. However, this is practicable method and has an advantage that the first defective limit determination unit 115 is not necessary.

Moreover, in the above embodiment, as shown in FIG. 5, the first device test is performed in the probe test before repair 111; the second device test is performed in the probe test after repair 145 for classification of the class B devices;

and the picking of the class B devices is performed by hardware of the first defective limit determination unit 115 shown in FIG. 6, simultaneously with the second device text. Alternatively, if desired, instead of performing the second device test, the following operation may be preformed. The fail information for all the memory cells stored in the defect analysis memory AFM by the probe test before repair 110, i.e., the first device test, is read out, and defective cell information indicating the repaired cell is received from the repair process 130. Based on both the fail information and the defective cell information, the repaired defective cell is set aside and then the classification similar to that performed by the first defective limit determination unit 115 described above is performed. Thus, the class B device can be picked. In this case, since the class B device is picked by software, the process time is increased. However, this is practicable and has an advantage that the need of the first defective limit determination unit 115 that is constructed by hardware is eliminated and the second device test, i.e., the probe test after repair 145 for classification of the class B devices can be omitted.

Moreover, when the repair process 130 shown in FIG. 5 was removed, a rate of devices, that can be remedied as non-defective devices by the presence or absence of the repair process, in the non-defective devices 221, the second class B devices 223 and the second defective devices 222 may be small. In this case, the probe test before repair 110, the repair process 130 and the probe test after repair for classification of the class B devices 145 may be removed, if desired. This increases the rate of the class B devices. However, since the class B devices can be shipped as products, the removal of the above processes 110, 130 and 145 is practicable. In this case, in addition to the cost reduction achieved by that removal, an advantage is achieved that the number of devices that can be obtained from a single plate of wafer because a repair circuit is not required in each device and thus the chip area is decreased. The increase of the number of the devices also contributes the cost reduction largely. Moreover, from a viewpoint of fabrication schedule, the above removal of the processes is advantageous because it greatly shortens the fabrication schedule.

In addition, in a case of a memory applied to a lower bit closer to LSB in an image memory, various threshold values mentioned above may be set to make the condition looser. Thus, in order to achieve this, a plurality of series of first defective limit determination unit 115 are provided so as to allow simultaneous classification of devices into M (M is integer equal to or larger than one) types of devices depending on the frequency of defect. In this case, the devices are classified into class B devices and at least one rank of devices lower than class B, such as class C devices, class D devices and the like. Therefore, the number of the devices that is determined to be defective is further reduced. As a result, an advantage is achieved that the yield can be further improved.

Figure 11:
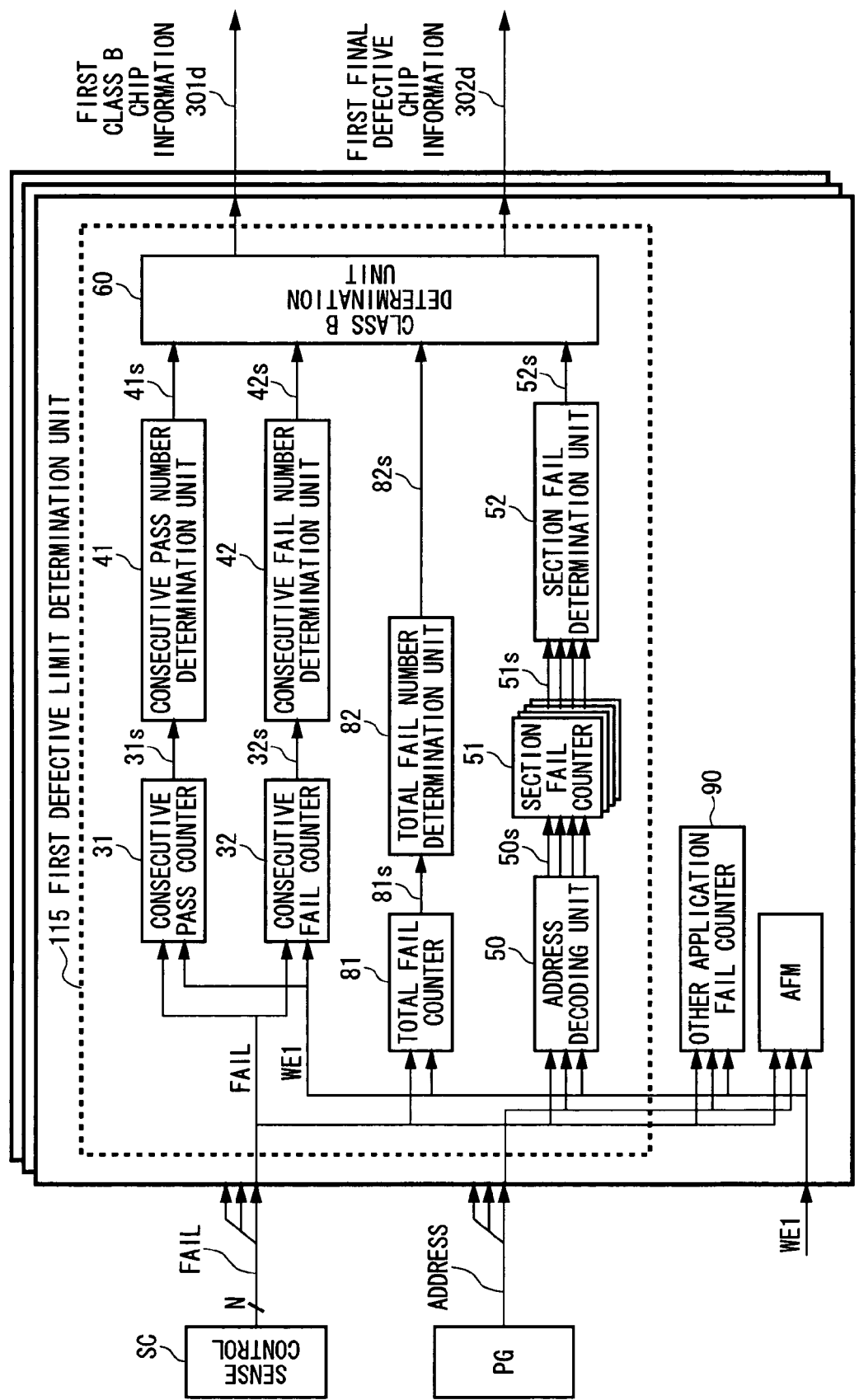
FIG. 11 is a diagram of another exemplary structure of a semiconductor test apparatus of the present invention, including the first defective limit determination unit and associated components.

As shown in FIG. 11 showing another exemplary structure of the semiconductor test apparatus of the present invention that includes the first defective limit determination unit and associated components, an address decoding unit 50, a plurality of section fail counters 51 and a section fail determination unit 52 may be additionally provided.

While an address space of a memory is divided into a plurality of sections, for example, 256 sections, based on an externally set condition, the address decoding unit 50 divides an address signal received from PG into 256 sections and decodes it and, when a fail signal FAIL received from the sense controller SC is asserted, generates a decoded signal 50s for a corresponding address section.

A plurality of section fail counters 51 include 256 channels of counter, for example. In practice, a counter function of 256 channels is realized by a single memory. The channel that receives the decoded signal 50s on the above assertion is incremented by one. As a result, at the end of the test, fail count information 51s is obtained for every 256 sections.

The section fail determination unit 52 receives the fail count information of 256 channels for every section at the end of the test, and outputs a section fail signal 52s in a case where there is a channel exceeding a desired threshold value, so as to supply the section fail signal 52s to the class B device determination unit 60.

Also in a case where the class B device determination unit 60 received the above section fail signal 52s, the class B device determination unit 60 determines the corresponding DUT to be defective. Thus, the class B devices can be picked by a further classification condition.

The components or parts that can be practically applied to function means to be implemented may be implemented by hardware logic, or by both software or micro program and hardware logic, or by software.

The present invention has the following advantageous effects from the above description.

As described above, according to the present invention, a means for picking a class B device that can be applied to a specific application is provided. Thus, a part of ICs that were discarded in the conventional classification can be shipped as class B products. As a result, the effective yield can be improved, and the reduction of the fabrication cost can be achieved.

Accordingly, the technical effects of the present invention, as well as the economic effects, are large.

What is claimed is:

1. A semiconductor test apparatus for classifying devices under test (DUTs) each having a memory function or includes the memory function therein, comprising:
    a specific application classifying means for classifying the DUTs into non-defective products if all memory cells in the DUTs work normally, specifically used DUTs, and defective products,
    wherein the specific application classifying means classifies the DUTs as the specifically used DUTs if a distribution condition of one or more defective memory cells of the DUTs is within a predetermined range in which the DUTs are usable as devices comparable to the non-defective products in a specific application.

2. The semiconductor test apparatus as claimed in claim 1,
    wherein said specifically used DUTs are classified into a plurality of types, the number of the types being M, and
    said specific application classifying means determines, based on M types of threshold condition that correspond to the M types of the specifically used DUTs, whether the defective memory cell satisfies the predetermined distribution condition that is acceptable for the specific application, to classify the DUTs into the non-defective products, the M types of specifically used DUTs, and the defective products.

3. The semiconductor test apparatus as claimed in claim 1,
    wherein said specific application classifying means includes a defective cell counting means for counting the number of total defective cells in all the memory cells of each DUT, and outputting a total fail signal that indicates whether the counted number is acceptable, and the specific application classifying means determines the DUT to be the specifically used DUT when the number of the defective cells is equal to or less than a particular number.

4. The semiconductor test apparatus as claimed in claim 3, wherein said defective cell counting means continuously receive FAIL information or PASS information, that indicates whether each memory cell is defective in the DUT, and said defective cell counting means includes:

a total fail counter for counting a total number of fail occurrences of said FAIL information; and a total fail number determination unit for outputting a total fail signal if said total number of fail occurrences is equal to or larger than a predetermined threshold value.

5. The semiconductor test apparatus as claimed in claim 1, wherein said specific application classifying means includes a defective cell dispersed condition measuring means for measuring a condition of dispersion of occurrences of defective cells in all the memory cells in each DUT, and outputting a minimum consecutive PASS defective signal indicating whether the measured dispersed condition is acceptable, and determines the DUT to be the specifically used DUT when the occurrences of the defective cells are dispersed with a predetermined dispersed condition.

6. The semiconductor test apparatus as claimed in claim 5, wherein said defective cell dispersed condition measuring means continuously receives FAIL information or PASS information, that indicates whether each memory cell in the DUT is defect, and includes:

a consecutive PASS counter for counting a number of consecution of said PASS information in a predetermined fail section; and a consecutive PASS number determination unit for outputting a minimum consecutive PASS defective signal if the number counted by said consecutive PASS counter is equal to or less than a predetermined threshold value.

7. The semiconductor test apparatus as claimed in claim 1, wherein said specific application classifying means includes a defective cell distribution condition measuring means for measuring a condition of distribution of occurrences of defective cells in all the memory cell of the DUT and outputting a section fail signal that indicates whether the measured condition is acceptable, and determines the DUT to be the specifically used DUT when the occurrences of the defective cells are distributed with a predetermined distribution condition.

8. The semiconductor test apparatus as claimed in claim 7, wherein said defective cell distribution condition measuring means continuously receives FAIL information or PASS information, that indicates whether each memory cell of the DUT is defective, and includes:

a predetermined plurality of section fail counters for dividing all the memory cells into a predetermined plurality of sections and counting a number of fail occurrences in each of the sections; and a section fail number determination unit for outputting a section fail signal when a counted value of any of the section fail counters exceeds a predetermined threshold value.

9. The semiconductor test apparatus as claimed in claim 1, wherein said specific application classifying means includes a consecutive defects determining means for counting a number of consecutive occurrences of defective cells in all the memory cells in the DUT and outputting a consecutive FAIL accepting signal that indicates whether the counted number is acceptable, and determines the DUT to be the specifically used DUT when the counted number is equal to or less than a particular number.

10. The semiconductor test apparatus as claimed in claim 9, wherein said consecutive defects determining means continuously receives FAIL information or PASS information, that indicates whether each memory cell of the DUT is defect, and includes:

a consecutive FAIL counter for counting a number of consecution of said FAIL information; and a consecutive FAIL number determination unit for outputting a consecutive FAIL accepting signal if a value counted by said consecutive FAIL counter is equal to or less than a predetermined threshold value.

11. The semiconductor test apparatus as claimed in claim 1, wherein said specific application classifying means includes:

a defective cell counting means for counting a number of defective cells in all the memory cells in the DUT as a total fail number and outputting a total fail signal indicating whether the total fail number thus counted is acceptable;

a consecutive defect number determination means for counting a number of consecutive occurrences of the defective cells in all the memory cells in the DUT and outputting a consecutive FAIL accepting signal that indicates whether the thus counted number is acceptable;

a defective cell dispersed condition measuring means for measuring a condition of dispersion of the occurrences of the defective cells in all the memory cells in the DUT and outputting a minimum consecutive PASS defect signal that indicates whether the measured condition is acceptable; and a class B device determination unit for picking an acceptable class B device based on said total fail signal, said consecutive FAIL accepting signal and said minimum consecutive PASS defect signal.

12. The semiconductor test apparatus as claimed in claim 1, wherein said specific application classifying means includes:

a defective cell counting means for counting a number of defective cells in all the memory cells in the DUT as a total fail number and outputting a total fail signal indicating whether the total fail number thus counted is acceptable;

a consecutive defect number determination means for counting a number of consecutive occurrences of the defective cells in all the memory cells in the DUT and outputting a consecutive FAIL accepting signal that indicates whether the thus counted number is acceptable;

a defective cell dispersed condition measuring means for measuring a condition of dispersion of the occurrences of the defective cells in all the memory cells in the DUT and outputting a minimum consecutive PASS defect signal that indicates whether the measured dispersed condition is acceptable;

a defective cell distribution condition measuring means for measuring a condition of distribution of the occurrences of the defective cells in all the memory cells in the DUT and outputting a section fail signal that indicates whether the measured distribution condition is acceptable; and a class B device determination unit for picking an acceptable class B device based on said total fail signal, said consecutive FAIL accepting signal, said minimum consecutive PASS defect signal and said section fail signal.

13. The semiconductor test apparatus as claimed in claim 1, wherein said specific application classifying means is adapted to apply a first step of classification to DUTs after a repair process of the memory cells, and to apply a second step of classification to DUTs in package test.

14. The semiconductor test apparatus as claimed in claim 1, wherein said specific application classifying means is adapted to apply classification only to DUTs in package test.

15. The semiconductor test apparatus as claimed in claim 1, wherein said specific application classifying means is adapted to apply classification only to DUTs in package test in the test/processing processes excluding the pre-repair probe test process, the repair process and the post-repair class B device classifying process.

16. A semiconductor test apparatus as claimed in claim 1, wherein said specific application classifying means includes a first specific application classifying means for classifying the DUTs into the non-defective products and first defective products, and
a second specific application classifying means for classifying the fast defective products into the specifically used DUTs and the defective products.

17. A semiconductor test apparatus as claimed in claim 1, wherein the memory function includes an image memory function, and the predetermined range is a range in which a man hardly recognizes defective spots on a display which is caused by one or more defective memory cells.

18. A method for classifying devices under test (DUTs) each containing a plurality of memory cells, comprising:
classifying a DUT as non-defective if all the plurality of memory cells of the DUT work normally;
classifying a DUT as a specific-use DUT if the DUT comprises one or more defective memory cells, but a distribution condition of the one or more defective memory cells of the DUT is within a predetermined range in which the DUT is usable as a device comparable to the non-defective DUT in a specific application; and
classifying a DUT as a defective device otherwise.

19. A semiconductor testing system for testing devices under test (DUTs) each containing a plurality of memory cells, comprising:
a classification unit adapted to classify a DUT as
a non-defective device if all the plurality of memory cells of the DUT work normally;
a specific-use device if the DUT comprises one or more defective memory cells, but a distribution condition of the one or more defective memory cells of the DUT is within a predetermined range in which the DUT is usable as a device comparable to the non-defective device in a specific application; and
a defective device otherwise.

20. The system of claim 19, wherein the classification unit comprises:
a defective cell counting unit for counting a number of defective cells among all the plurality of memory cells of the DUT as a total fail number, and outputting a total fail signal indicating whether the total fail number is acceptable;
a consecutive defect number determination unit for counting a number of consecutive occurrences of the defective cells in all the plurality of memory cells of the DUT, and outputting a consecutive FAIL accepting signal that indicates whether the number of consecutive occurrences of the defective cells is acceptable;
a defective cell dispersed condition measuring unit for measuring a condition of dispersion of the occurrences of the defective cells in all the plurality of memory cells of the DUT, and outputting a minimum consecutive PASS defect signal that indicates whether the measured condition is acceptable; and
a class B device determination unit for picking an acceptable class B device based on said total fail signal, said consecutive FAIL accepting signal, and said minimum consecutive PASS defect signal.

21. The system of claim 19, wherein the classification unit comprises:
a defective cell counting unit for counting a number of defective cells in all the plurality of memory cells in the DUT as a total fail number, and outputting a total fail signal indicating whether the total fail number is acceptable;
a consecutive defect number determination unit for counting a number of consecutive occurrences of the defective cells in all the plurality of memory cells of the DUT, and outputting a consecutive FAIL accepting signal that indicates whether the number of consecutive occurrences of the defective cells is acceptable;
a defective cell dispersed condition measuring unit for measuring a condition of dispersion of the occurrences of the defective cells in all the plurality of memory cells of the DUT, and outputting a minimum consecutive PASS defect signal that indicates whether the measured condition is acceptable;
a defective cell distribution condition measuring unit for measuring a condition of distribution of the occurrences of the defective cells in all the plurality of memory cells of the DUT, and outputting a section fail signal that indicates whether the measured distribution condition is acceptable; and
a class B device determination unit for picking an acceptable class B device based on said total fail signal, said consecutive FAIL accepting signal, said minimum consecutive PASS defect signal, and said section fail signal.

* * * * *

UNITED STATES PATENT AND TRADEMARK OFFICE
CERTIFICATE OF CORRECTION

| | |
|---|---|
| PATENT NO. | : 7,388,393 B2 |
| APPLICATION NO. | : 10/871113 |
| DATED | : June 17, 2008 |
| INVENTOR(S) | : Kazuhiro Yamamoto |

It is certified that error appears in the above-identified patent and that said Letters Patent is hereby corrected as shown below:

In Claim 9, column 16, line 5, after the word "and" the word "detennines" should be --determines--.

In Claim 16, column 17, line 25, before the word "defective" the word "fast" should be --first--.

Signed and Sealed this

Twenty-sixth Day of August, 2008

JON W. DUDAS
*Director of the United States Patent and Trademark Office*